United States Patent

Mehta

[11] Patent Number: 6,034,893
[45] Date of Patent: Mar. 7, 2000

[54] NON-VOLATILE MEMORY CELL HAVING DUAL AVALANCHE INJECTION ELEMENTS

[75] Inventor: Sunil D. Mehta, San Jose, Calif.

[73] Assignee: Vantis Corporation, Sunnyvale, Calif.

[21] Appl. No.: 09/334,052

[22] Filed: Jun. 15, 1999

[51] Int. Cl.[7] .................................................... G11C 16/04
[52] U.S. Cl. .............................. 365/185.14; 365/185.31; 365/185.1; 365/185.18; 365/185.27; 365/187; 365/188; 257/318; 257/319; 257/320; 257/322
[58] Field of Search ................... 365/185.14, 185.31, 365/185.1, 185.18, 185.27, 182, 187, 188; 257/318, 319, 320, 322; 326/45, 44

[56] References Cited

U.S. PATENT DOCUMENTS

| 5,646,901 | 7/1997 | Sharpe-Geisler et al. | 365/218 |
| 5,666,309 | 9/1997 | Peng et al. | 365/185.08 |
| 5,748,525 | 5/1998 | Wong et al. | 365/185.05 |

OTHER PUBLICATIONS

U.S. Application No. 09/334,051 filed Jun. 15, 1999 by Mehta et al., entitled "Zero–Power CMOS Nonvolatile Memory Cell Having an Avalanche Injection Element", now allowed.

Primary Examiner—Andrew Q. Tran
Attorney, Agent, or Firm—Brinks Hofer Gilson & Lione

[57] ABSTRACT

A non-volatile memory cell includes a well region formed in a semiconductor substrate. First and second avalanche injection elements reside in the well region. A bifurcated floating-gate electrode includes a first segment overlying the first avalanche injection element and a second segment overlying the second avalanche injection element. A first contact region resides in the well region adjacent to the first segment of the floating-gate electrode, and a second contact region resides in the well region adjacent to the second segment of the floating-gate electrode. Upon the application of programming or erasing voltage, electrical charge is independently transferred to each of the first and second segments of the floating-gate electrode from the first and second avalanche injection elements, respectively.

20 Claims, 2 Drawing Sheets

NON-VOLATILE MEMORY CELL HAVING DUAL AVALANCHE INJECTION ELEMENTS

RELATED APPLICATIONS

Related subject matter is disclosed in commonly-assigned, co-pending patent application Ser. No. 09/310,071 filed May 11, 1999, and titled "Floating Gate Memory Apparatus And Method For Selected Programming Thereof," now pending, the disclosure of which is incorporated by reference herein.

FIELD OF THE INVENTION

This invention relates, in general, to non-volatile memory devices, and more particularly, to EEPROM cells containing an avalanche injection element for programming.

BACKGROUND OF THE INVENTION

Many types of integrated circuit devices include non-volatile memory cells in order to increase the performance of the integrated circuits. To minimize the additional chip area required for the non-volatile memory cells, cell designers strive for designs which are compact and be reduced in size to match the dimensions of other circuit components within the integrated circuit device. Additionally, non-volatile memory cell designers seek to design non-volatile memory cells that are capable of operating at low power. By developing non-volatile memory cells capable of being programmed and erased at low power, the memory cells become more compatible with existing circuitry in electrically-erasable-programmable-read-only-memory (EEPROM) integrated circuit devices. For example, EEPROM cells typically require 13 to 15 volts for programming and erasing. This voltage level is considerably greater than the 1.8 to 3 volt operating potentials used by many integrated circuits.

Conventional programming and erasing of EEPROM devices is carried out by either hot carrier injection, or by Fowler-Nordheim tunneling. Both conventional programming and erasing methods require application of relatively high voltages to store and remove charge form the floating-gate transistor within the EEPROM cell. Reduced programming voltages can be obtained through the use of a Zener diode within the substrate immediately below the floating-gate electrode. Programming and erasing of an EEPROM cell having a Zener/avalanche diode can be carried out at voltage levels of about 6 to 8 volts. Accordingly, by incorporating an EEPROM device having a Zener/avalanche diode the EEPROM cell can be operated at low power and can be powered by a relatively small power supply.

Typically, an EEPROM cell having a Zener/avalanche diode comprises a source and drain region underlying a floating gate electrode. An implant region is included within the channel of opposite conductivity type to that of the source and drain. This creates a P-N junction in close proximity to the floating-gate electrode.

To program the Zener EEPROM cell, the P-N junction is reversed-biased to create an electric field of approximately $10^6$ volt/cm. The electric field generates energetic hot electrons that are injected across the dielectric layer separating the floating-gate from the channel region. A low junction breakdown voltage can be used for programming by optimizing the P-N junction depth and junction profile.

While the incorporation of Zener/avalanche structures in EEPROM memory cells has reduced the programming and erasing voltage levels necessary for cell operation, further improvements are necessary to fully realize the operational efficiency possible with this type of non-volatile memory cell. Improvements in the programming and erasing of individual cells will result in improved performance. Further development of EEPROM cells that incorporate sense transistors as part of the read path are needed to provide non-volatile memory cells capable of operation at very low power levels.

SUMMARY OF THE INVENTION

The present invention is for a non-volatile memory cell and array that incorporates avalanche injection elements for program and erase operations. In accordance with the invention, dual floating-gate electrodes are formed to overlie the avalanche injection elements. In one embodiment, a bifurcated floating-gate electrode is provided having a first segment overlying a first avalanche injection element, and a second segment overlying a second avalanche injection element. By forming separate floating-gate electrode segments, the programming and erasing elements within a non-volatile memory cell can be separately optimized for maximum cell performance. The creation of independent programming an erasing elements within a non-volatile memory cell improve both programming efficiency and cell reliability.

In one form, a non-volatile memory cell, arranged in accordance with the invention, includes a first channel region of a first conductivity type, and a second channel region of the first conductivity type. A first contact region of a second conductivity type separates the first and second channel regions and forms a first avalanche injection element and a second avalanche injection element. A bifurcated floating-gate electrode has a first segment overlying the first channel region, and a second segment overlying the second channel region.

BRIEF DESCRIPTION ON OF THE DRAWING

Figure 1:
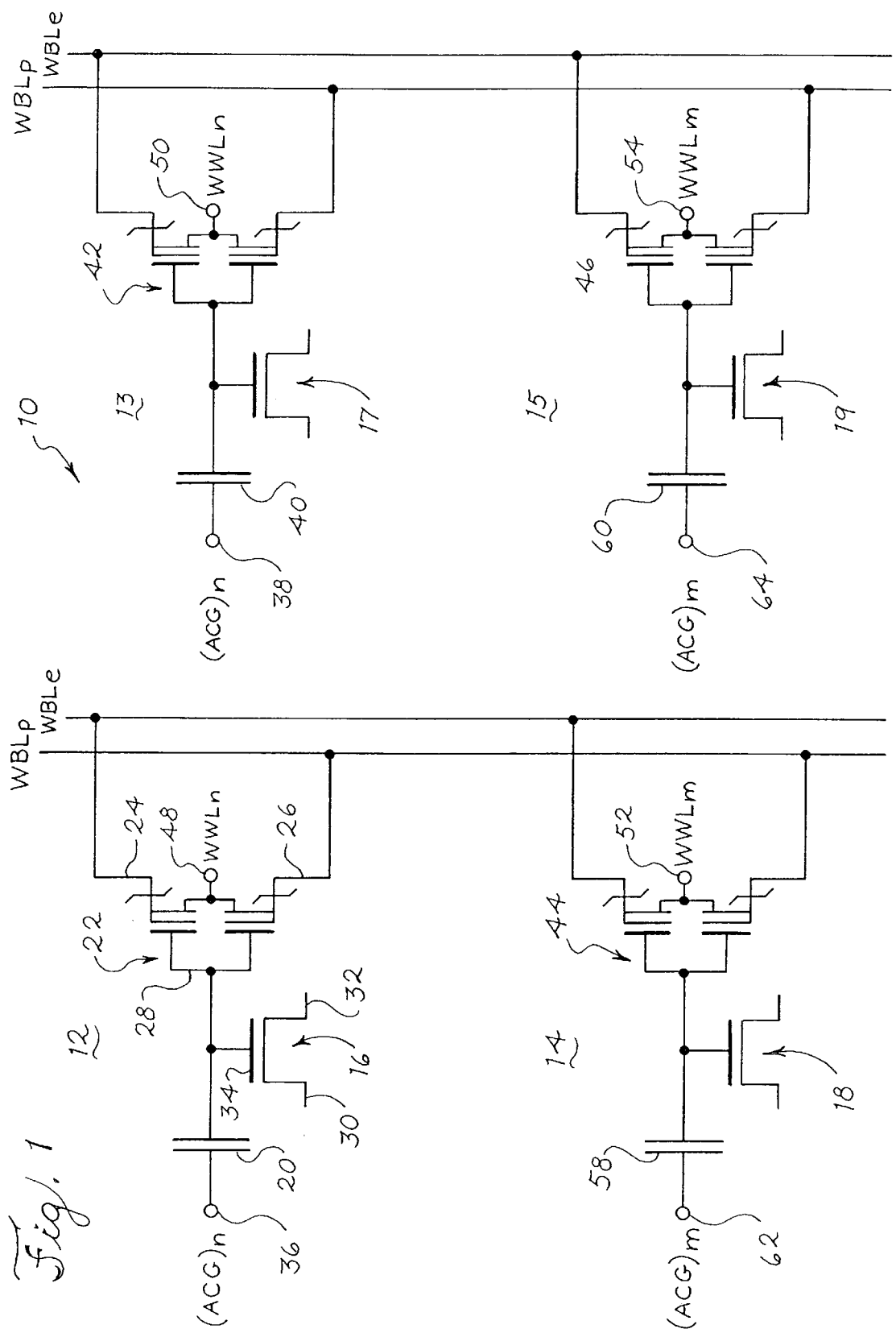
FIG. 1 is a schematic diagram of a non-volatile memory array including non-volatile memory cells arranged in accordance with the invention.

It will be appreciated that for simplicity and clarity of illustration, elements shown in the Figures have not necessarily been drawn to scale. For example, the dimension of some of the elements are exaggerated relative to each other for clarity. Further, where considered appropriate, reference numerals have been repeated among the Figures to indicate corresponding elements.

DETAILED DESCRIPTION OF PREFERRED EMBODIMENTS

FIG. 1 illustrates a non-volatile memory array incorporating non-volatile memory cells arranged in accordance with the invention. In one embodiment, a two-by-two matrix 0 includes non-volatile memory cells 12, 13, 14 and 15. While only sense transistors, such as sense transistors 16, 17, 18, and 19 are shown for each cell, typically the sense element is coupled to read path circuitry, such as a read element. Further, while only four cells are shown, it will be understood that these four cells generally comprise a portion of a larger array of cells. Cell 12 is exemplary of each cell in matrix 10.

Cell 12 includes a capacitor 20, a floating-gate sense transistor 16, and a floating-gate program element 22. Element 22 includes a first contact region 24 connected to a first program line (WBL$_p$), a second contact region 26 connected to a first erase line (WBL$_e$), and a floating-gate electrode 28. Sense transistor 16 includes a source region 30, a drain region 32, and a floating-gate electrode 34. Floating-gate electrode 34 is connected to the row n array control gate (ACG$_n$) at node 36 by capacitor 20. Sense transistor 16 provides the sense element for circuitry, such as read circuitry (not shown), which is utilized in detecting the state of non-volatile memory cell 12. Source region 30 and drain region 32 of sense transistor 16 may be connected to read circuitry and electrical couplings as discussed above, or in any number of other well-known arrangements.

Non-volatile memory cells 12 and 13 share a first common ACG connection ACG$_n$ at nodes 36 and 38, which are coupled to capacitors 20 and 40, respectively. Likewise, program elements 22 and 42 share a first common word line connector (WWL$_n$). First program line (WBL$_p$) electrically couples the first contact regions of program elements 22 and 44 of non-volatile memory cells 12 and 14, respectively. Additionally, an erase line (WBL$_e$) electrically couples the second contact regions program elements 22, and 44 of non-volatile memory cells 12 and 14, respectively.

Non-volatile memory cells 12 and 13 share a common cell select line (WWL$_n$) at nodes 48 and 50, respectively. Likewise, non-volatile memory cells 14 and 15 share common select line (WWEL$_m$) at nodes 52 and 54, respectively. Capacitors 58 and 60 are connected to a common array control gate (ACG$_m$) at nodes 62 and 64.

In each cell, a portion of the bifurcated floating-gate electrode is coupled to the sense transistor. Each program element (for example element 22) includes a first and second segment of the floating-gate electrode and an avalanche injection element underlying each floating-gate segment, which provides hot carriers for programming and erasing the non-volatile memory cell.

Table I shows an exemplary application of the voltages applied on the respective conductors in accordance with the present invention.

TABLE I

|  | WBL$_p$ | WBL$_e$ | WWL$_m$ | WWL$_n$ | ACG$_n$ | ACG$_m$ |
|---|---|---|---|---|---|---|
| PROGRAM | 6v | 3v | 3v | 0v | +8v | 0v |
| ERASE | 6v | 3v | 3v | 0v | 0v | 0v |

So applied, only one cell in the array, in this case cell 12, will have an avalanche injector element which is in breakdown mode, while each of the other cells will not be in breakdown mode. This assumes that a breakdown state of 6 volts, where 6 volts are above the avalanche breakdown mode, while 3 volts are below the avalanche breakdown mode. Hence, in one embodiment, non-volatile memory cells 12, 13, 14 and 15 are only an avalanche breakdown when WBLP equals approximately 6 volts, and WWL equals approximately zero volts for an individual cell. The selected cell (12 in this example) may be charged to +V$_e$ or −V$_p$ (enhanced erase or program) according to the bias on the ACG. Non-volatile memory cells 13 and 14 have a voltage across their P/N junctions of only three volts and hence are not in avalanche or Zener breakdown mode. Memory cell 15 has three volts on both WWL$_m$ and WBL$_m$ and hence there is zero volts across the breakdown region. In another embodiment of the invention, the individual programming elements, such as elements 22, 44, and 46 can be placed in individual well regions. By providing individual well regions for each memory cell, each cell can be individually selected and subjected to the programming scheme set forth above.

Figure 2:
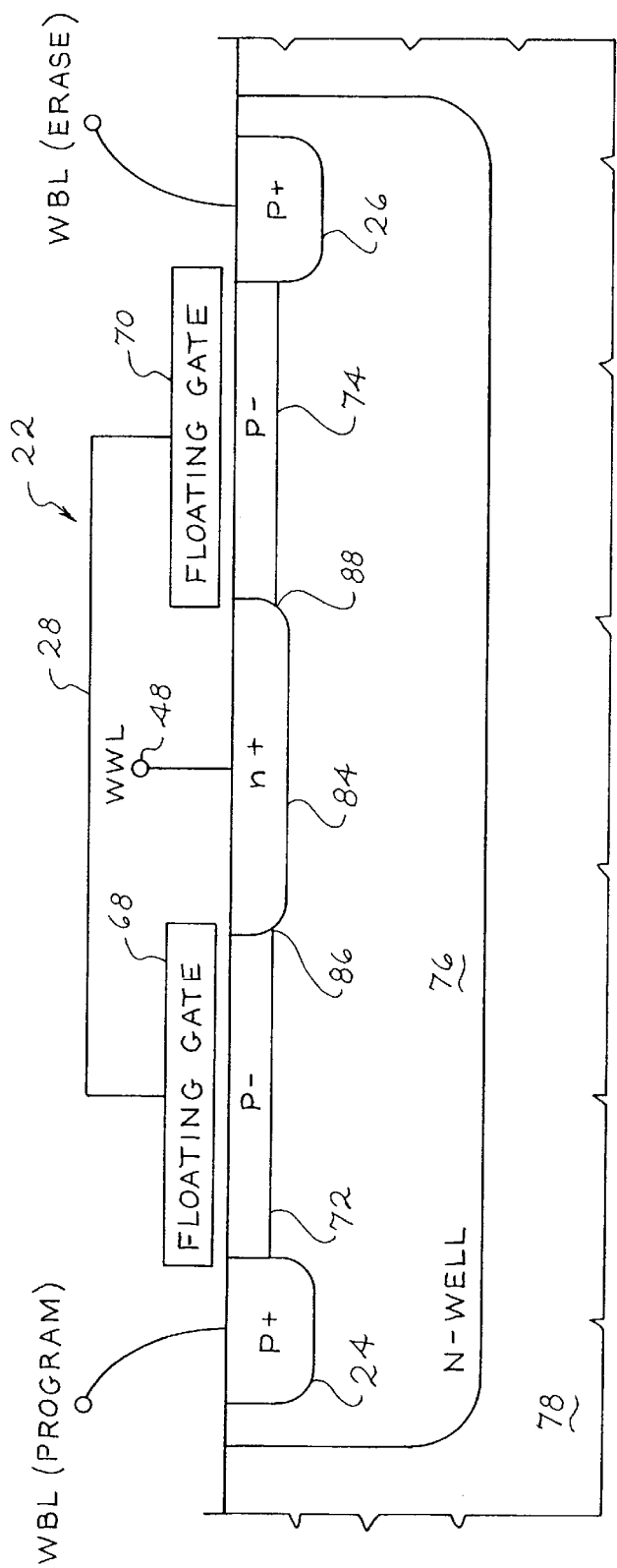
FIG. 2 illustrates, in cross-section, a non-volatile memory cell formed in accordance with the invention.

FIG. 2 illustrates, in cross-section, program element 22 of non-volatile memory cell 12. In accordance with the invention, floating-gate electrode 28 includes a first segment 68 and a second segment 70. First segment 68 overlies a first channel region 72 and second segment 70 overlies a second channel region 74. Both first and second channel regions 72 and 74 reside in a well region 76, which in turn, resides in a semiconductor substrate 78. A first contact region 80 resides in well region 76 adjacent to first channel region 72 and generally aligned with an edge of first floating-gate segment 68. A second contact region 82 resides in well region 76 adjacent to second channel region 74, and is generally aligned with an edge of second floating-gate segment 70. A third contact region 84 also resides in well region 76 and separates first and second channel region 72 and 74, respectively.

Program line WBL$_p$ is electrically coupled to first contact region 24, erase line WBL$_e$ is electrically coupled to second contact region 26. Further, node 48 is electrically coupled to third contact region 84.

A first avalanche injection element 86 is formed by the P/N junction at the interface between first channel region 72 and third contact region 84. Additionally, a second avalanche injection element 88 is created at the interface between second channel region 74 and third contact region 84.

Figure 3:
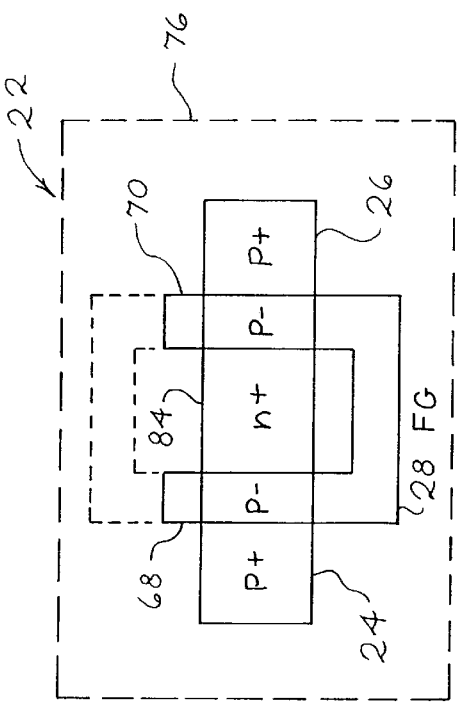
FIG. 3 is a top view of a non-volatile memory cell arranged in accordance with one embodiment of the invention.

A top view of non-volatile memory cell 12 is illustrate in FIG. 3. As illustrated, floating-gate electrode 28 and its first and second segments 68 and 70 do not extend beyond the area defined by well region 76. In accordance with the invention, each program element is entirely contained within a well region. The isolation of the program elements within individual well regions enables specific memory cells within the array to be selected for programming and erasing.

Those skilled in the art will recognize that the bifurcated geometry of floating-gate electrode 28, together with independent channel regions for each floating-gate segment, permits independent optimization of the programming and erasing elements within a non-volatile memory cell. For example, floating-gate segments 68 and 70 can be fabricated to have different gate lengths. Further, the doping concentrations within first and second channel regions 72 and 78 can be varied relative to each other. Accordingly, common non-volatile memory failure mechanisms, such as charge leakage, and the like, can be minimized through independent fabrication of the programming and erasing elements within the non-volatile memory cells of the invention.

Thus it is apparent that there has been disclosed, in accordance with the invention, a non-volatile memory cell having dual avalanche injection element that fully provides the advantages set forth above. Although the invention has been described and illustrated with reference to specific illustrative embodiments thereof, it is not intended that the invention be limited to those illustrative embodiments. Those skilled in the art would recognize that variations and modifications can be made without departing from the spirit of the invention. For example, the conductivities of the substrate, well region, contact regions, and channel regions can be reversed from that illustrated in the Figures. It is therefore intended to include within the invention all such variations and modifications as they fall within the scope of the appended claims and equivalents thereof.

I claim:

1. A non-volatile memory cell comprising:
   a first channel region of a first conductivity type;
   a second channel region of the first conductivity type;
   a first contact region of a second conductivity type separating the first channel region from the second channel region and forming a first avalanche injection element and a second avalanche injection element; and
   a bifurcated floating-gate electrode having a first segment overlying the first channel region and a second segment overlying the second channel region.

2. The cell of claim 1 further comprising:
   a second contact region of the first conductivity type separated from the first contact region by the first channel region; and
   a third contact region separated from the first contact region by the second channel region.

3. The cell of claim 2, wherein a programming bit line is electrically coupled to one of the second and third contact regions and an erase bit line is electrically coupled to the other of the second and third contact regions.

4. The cell of claim 1, wherein the first and second channel regions and the first, second, and third contact regions are located in a well region of the second conductivity type.

5. The cell of claim 4, wherein a word line is electrically coupled to the first contact region.

6. A non-volatile memory cell comprising:
   first and second avalanche injection elements;
   a bifurcated floating-gate electrode having a first segment overlying the first avalanche injection element and a second segment overlying the second avalanche injection element;
   a first contact region adjacent to the first segment;
   a second contact region adjacent to the second segment; and
   a programming line electrically coupled to one of the first and second contact regions and an erase line electrically coupled to the other of the first and second contact regions.

7. The cell of claim 6 further comprising a first channel region intermediate to the first avalanche injection element and the first contact region, and a second channel region intermediate to the second avalanche injection element and the second contact region.

8. The cell of claim 7 further comprising a third contact region intermediate to the first and second channel regions, wherein the first avalanche injection element comprises a junction between the first channel region and the third contact region and the second avalanche injection element comprises a junction between the second channel region and the third contact region.

9. The cell of claim 8 further comprising a well region enclosing the first and second channel region, and the first, second and third contact regions.

10. The cell of claim 9 further comprising a cell select line electrically coupled to the well region.

11. A non-volatile memory cell comprising:
    a well region in a semiconductor substrate;
    first and second avalanche injection elements in the well region;
    a floating-gate electrode having a first portion overlying the first avalanche injection element and a second portion overlying the second avalanche injection element;
    a first contact region in the semiconductor substrate adjacent to the first portion of the floating-gate electrode and a second contact region in the well region adjacent to the second portion of the floating-gate electrode; and
    a third contact region of a first conductivity type in the well region intermediate to the first and second portions of the floating-gate electrode,
    wherein electrical charge is independently transferred to each of the first and second portions of the floating-gate electrode from the first and second avalanche injection elements, respectively.

12. The cell of claim 11 further comprising a programming line electrically coupled to one of the first and second contact regions and an erase line electrically coupled to the other of the first and second contact regions.

13. The cell of claim 12 further comprising a cell select line electrically coupled to the well region.

14. The cell of claim 11 further comprising a first channel region in the well region underlying the first portion of the floating-gate electrode, and a second channel region in the well region underlying the second portion of the floating-gate electrode.

15. The cell of claim 14, wherein the first avalanche injection element comprises a junction between the first channel region and the third contact region and the second avalanche injection element comprises a junction between the second channel region and the third contact region.

16. A non-volatile memory array comprising:
    a plurality of memory cells, each cell including first and second avalanche injection elements, a bifurcated floating-gate electrode having a first segment overlying the first avalanche injection element and a second segment overlying the second avalanche injection element, and first and second contact regions adjacent to the first and second segments, respectively; and
    a program line electrically coupled to one of the first and second contact regions of each memory cell and an erase line electrically coupled to the other of the first and second contact regions of each memory cell,
    wherein the first avalanche injection element is responsive to a voltage applied to the first contact region and the second avalanche injection element is responsive to a voltage applied to the second contact region.

17. The array of claim 16, wherein each of the plurality of memory cells is formed in a separate well region.

18. The array of claim 17, wherein each memory cell further comprises a first channel region in the well region underlying the first segment of the floating-gate electrode, and a second channel region in the well region underlying the second segment of the floating-gate electrode.

19. The array of claim 18, wherein each memory cell further comprises a third contact region in the well region intermediate to the first and second channel regions.

20. The array of claim 19, wherein the memory cells are arranged in rows and columns, and wherein a cell select line is electrically coupled to the third contact region of the memory cells residing in each row.

* * * * *